United States Patent [19]

Bynum et al.

[11] Patent Number: 4,553,048

[45] Date of Patent: Nov. 12, 1985

[54] MONOLITHICALLY INTEGRATED THERMAL SHUT-DOWN CIRCUIT INCLUDING A WELL REGULATED CURRENT SOURCE

[75] Inventors: Byron G. Bynum; David L. Cave, both of Tempe, Ariz.

[73] Assignee: Motorola, Inc., Schaumburg, Ill.

[21] Appl. No.: 582,358

[22] Filed: Feb. 22, 1984

[51] Int. Cl.⁴ ............................................ H03K 17/30
[52] U.S. Cl. ................................ 307/350; 307/296 R; 307/310; 323/315; 361/103
[58] Field of Search ................................ 323/315–317, 323/313, 907; 307/310, 296 R, 350; 361/103

[56] References Cited

U.S. PATENT DOCUMENTS

| | | | |
|---|---|---|---|
| 4,004,462 | 1/1977 | Dobkin | 307/310 |
| 4,028,564 | 6/1977 | Streit et al. | 323/315 |
| 4,146,903 | 3/1979 | Dobkin | 361/103 |
| 4,204,133 | 5/1980 | Ahmed | 323/315 |

FOREIGN PATENT DOCUMENTS 202788  9/1983  German Democratic Rep. .................................... 361/103

OTHER PUBLICATIONS

Schade, "Themal Shutdown Circuit", RCA Tech. Note No. 1270, 3 Sheets, Mar. 2, 1981.

*Primary Examiner*—William H. Beha, Jr.
*Attorney, Agent, or Firm*—William E. Koch

[57] ABSTRACT

A thermal shut-down circuit is provided that is monolithically integrated in a power BIMOS process wherein a vertical power PNP output transistor comprises a P-type substrate as a collector. The circuit compensates for vertical currents injected from the P-substrate into lateral transistors. A first PNP transistor has an emitter connected to a first resistor and conducts a first current. A second PNP transistor has an emitter connected to a second resistor and conducts a second current. A third resistor has one terminal coupled to the emitter of the second transistor. A fourth resistor is coupled in series with an output means, the combination thereof being coupled in parallel with the second and third resistors.

10 Claims, 4 Drawing Figures

– PRIOR ART –

MONOLITHICALLY INTEGRATED THERMAL SHUT-DOWN CIRCUIT INCLUDING A WELL REGULATED CURRENT SOURCE

BACKGROUND OF THE INVENTION

1. Field of the Invention

This invention relates generally to a thermal shut-down circuit and, more particularly to a monolithically integrated thermal shut-down circuit for power BiMOS processes.

2. Background Art

Many applications, e.g., automotive electronics, exist wherein an integrated circuit die is subjected to high temperatures due to on-chip power dissipation and high ambient temperatures. These integrated circuits may comprise a vertical power structure having a P-type substrate and an N-type epitaxial layer overlying the substrate. P-type regions are diffused into the epitaxial layer. PNP vertical transistors may be formed between a P-region and the substrate. Lateral PNP transistors may be formed using the P-regions and the epitaxial layer. This structure is well understood by those skilled in the art.

The large currents drawn through these vertical power transistors, especially during fault conditions, e.g., shorted output, can cause the integrated circuit die temperature to rise excessively. A typical method of sensing overheating of an integrated circuit die and for providing a switch function to shut down the heat generating circuitry is to compare the base-emitter voltage, $V_{BE}$, of a bipolar transistor having a negative temperature coefficient with a circuit generated $\Delta V_{BE}$ voltage having a positive temperature coefficient.

This comparison may be accomplished by several different methods using bipolar transistors. One method comprises a bandgap voltage cell which generates a voltage proportional to $\Delta V_{BE}$ and compares it with $V_{BE}$ for providing a shut-down signal. The cell comprises first and second PNP transistors having collectors coupled to ground by first and second resistors, respectively, with the resistors having identical values. The collectors are also connected to the inverting input and noninverting input, respectively, of an amplifier. The output of the amplifier is connected to the bases of both transistors. The emitter of the first transistor is coupled to a node by a third resistor and the emitter of the second transistor is connected directly to the node. A fourth resistor is coupled between the node and a supply voltage. The first transistor has its emitter scaled to some multiple value greater than the emitter of the second transistor. In a manner known to those skilled in the art, and described in detail hereinafter, a voltage across the fourth resistor is proportional to the $\Delta V_{BE}$ between the first and second transistors and can be used for comparison to a $V_{BE}$ to accomplish a thermal shut-down function. The current through the fourth resistor however, when the cell is used in vertical output power transistor circuits, is subject to unknown quantities that causes the voltage across the fourth resistor to be an unkown quantity.

Any lateral PNP transistor, as used for the first and second transistor in the bandgap cell described above, can have a vertical current component collected from the P-type substrate. This occurs when the substrate is switched to a voltage level substantially equal to $V_{CC}$ supplied to the P-type regions serving as emitters of the PNP transistors. This vertical current is uncontrollable and unknown in value, substantially reducing the confidence level in predicting the voltage across the fourth resistor. Furthermore, if the $\Delta V_{BE}$ across the fourth resistor is compared to some $\Delta V_{BE}$, then the bases of the first and second transistors must be two $V_{BE}$ voltages below $V_{CC}$ which cannot occur when the substrate is switched to $V_{CC}$ and the PN diode from the substrate to any N-type epitaxial region constrains all PNP bases to be only one $V_{BE}$ below $V_{CC}$. Additionally, if the substrate is not switched to $V_{CC}$, an unpredictable current exists due to a vertical component from the lateral emitters which is collected by the substrate in the absence of a buried layer.

Thus, a need exists for an improved thermal shut-down circuit that compensates for any vertical current component supplied to or from the substrate.

SUMMARY OF THE INVENTION

Accordingly, it is an object of the present invention to provide an improved thermal shut-down circuit.

Another object of the present invention is to provide a thermal shut-down circuit that substantially eliminates any error caused by unwanted vertical current collected by or from the substrate.

Still another object of the present invention is to provide a thermal shutdown circuit having a well regulated current source.

In carrying out the above and other objects of the present invention in one form, there is provided an improved thermal shut-down circuit fabricated in monolithic integrated circuit form having a vertical structure including a P-type substrate serving as a collector of a vertical output PNP transistor. An N-type epitaxial layer overlies the substrate and serves as a base of the vertical output PNP transistor. A first lateral transistor has an emitter connected to a first resistor and conducts a first current. A second lateral transistor is scaled to some multiple value of the first transistor and has its emitter connected to a second resistor and conducts a second current, said first and second currents being substantially identical in value. A third resistor has one terminal coupled to the emitter of the second lateral transistor and conducts a third current. A fourth resistor is connected in series with a PNP transistor. The PNP transistor and fourth resistor are coupled in parallel with the second and third resistors for providing an output signal.

The above and other objects, features, and advantages of the present invention will be better understood from the following detailed description taken in conjunction with the accompanying drawing.

DETAILED DESCRIPTION OF THE INVENTION

Figure 1:
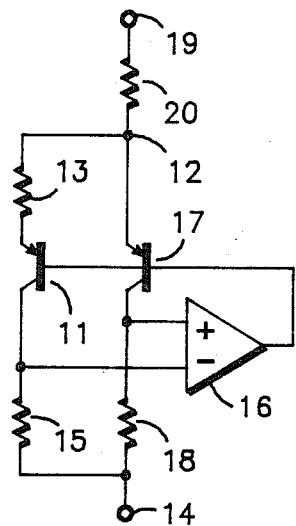
FIG. 1 illustrates in schematic form the previously known bandgap voltage cell.

Referring to FIG. 1, the previously known bandgap voltage cell comprises PNP transistor 11 having an emitter coupled to node 12 by resistor 13, and a collector coupled to supply voltage terminal 14 by resistor 15 and also connected to the inverting input of amplifier 16. PNP transistor 17 has an emitter connected to node 12 and a collector coupled to supply voltage terminal 14 by resistor 18 and also connected to the noninverting input of amplifier 16. The output of amplifier 16 is connected to the bases of transistors 11, 17. Node 12 is coupled to supply voltage terminal 19 by resistor 20.

Transistor 11 is scaled in a manner known to those skilled in the art so as to carry a lower current density than transistor 17. For example, the emitter area of transistor 11 may be four times the emitter area of transistor 17. Resistors 15 and 18 have equal value. Amplifier 16 provides negative feedback in a manner well known by those skilled in the art, forcing the collector voltages of transistors 11, 17 to be equal. For these collector voltages to be equal, the current through both transistors 11, 17 must be equal. Therefore, resistor 13 will develop $\Delta V_{BE}$ across it corresponding to the difference in $V_{BE}$ voltages of transistors 11 and 17. The current through transistors 11, 17 are summed through resistor 20, and the voltage across resistor 20 will be two $\Delta V_{BE}$ times the ratio of resistor 20 over resistor 13. In other words, a thermally responsive signal is provided at node 12 that is proportional to the $\Delta V_{BE}$ generated by the circuit.

In applications where the cell is monolithically integrated with a vertical power transistor structure having a P-type substrate and an N-type epitaxial layer overlying the P-type substrate, the voltage across resistor 20 becomes an unkonwn quantity. As the P-type substrate rises to a voltage substantially equivalent to that of $V_{CC}$, additional unwanted current is injected from the P-substrate into the epitaxial layer. This current is then collected by P-regions diffused into the epitaxial layer. This action causes circuit imbalance and uncontrolled current through resistor 20, making the voltage at node 12 unpredictable.

Figure 2:
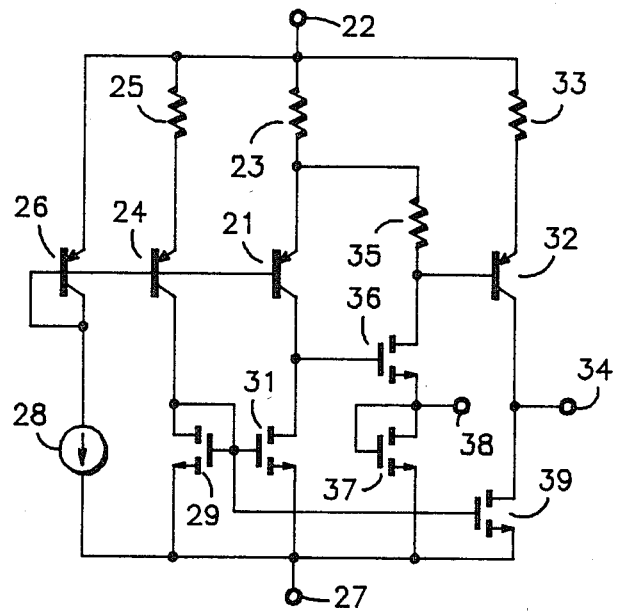
FIG. 2 illustrates in schematic form the preferred embodiment of the present invention.

Referring to FIG. 2, a thermal shut-down circuit in accordance with the present invention is shown which is suitable to be fabricated in monolithic integrated circuit form. PNP transistor 21 has an emitter coupled to supply voltage terminal 22 by resistor 23. PNP transistor 24 has an emitter coupled to supply voltage terminal 22 by resistor 25. Transistor 21 is scaled in a manner known to those skilled in the art so that it will carry a lower current density than transistor 24. For example, the emitter area of transistor 21 may be four times the emitter area of transistor 24.

PNP transistor 26 has an emitter connected to supply voltage terminal 12 and both its base and collector coupled to supply voltage terminal 27 by current source 28. The bases of transistors 21, 24, 26 are interconnected. Transistor 26 establishes a current that is mirrored by transistors 21, 24.

NMOS transistor 29 has a source connected to supply voltage terminal 27 and a drain connected to the collector of transistor 24. NMOS transistor 31 has a source connected to supply voltage terminal 27 and a drain connected to the collector of transistor 21. The gates of transistors 29, 31 are both connected to the collector of transistor 24. Transistors 29, 31 function as a current mirror, thereby insuring that transistors 21, 24 carry identical currents.

Output PNP transistor 32 has an emitter coupled to supply voltage terminal 22 by resistor 33, a collector connected to thermal shut-down signal terminal 34, and a base coupled to the emitter of transistor 21 by resistor 35. DMOS transistor 36 has a drain connected to the base of transistor 32, a gate connected to the collector of transistor 21, and a source connected to controlled current reference terminal 38 and both the gate and drain of DMOS transistor 37. The source of transistor 37 is connected to supply voltage terminal 27. Transistor 37 functions as a diode and provides a bias level for the controlled current reference signal on terminal 38.

NMOS transistor 39 has a drain connected to terminal 34, a source connected to supply voltage terminal 27, and a gate connected to the collector of transistor 24. Transistor 39 sets the voltage level at terminal 34 and may be any type of resistive device.

Since resistors 23 and 25 are substantially equal in value and transistor 21 is scaled to some multiple value greater than transistor 24, and if the currents through transistors 21, 24 are equal, then $V_{BE}$ of transistor 21 must be less than $V_{BE}$ of transistor 24 by $\Delta V_{BE}$. $\Delta V_{BE}$ is defined as $$\Delta V_{BE} = (KT/q) \ln n.$$

where n is the ratio of emitter area of transistors 21, 24, K is Boltzman's constant, T is absolute temperature, and q is the charge of an electron. If $\Delta V_{BE}$ did not occur, then the current through transistor 21 would be greater than that through transistor 24. Thus, the current through transistor 31 would be less than that through transistor 21 and the voltage on the collector of transistor 21 would rise. Transistor 36 would turn on, pulling current through resistors 23, 35 and lowering $V_{BE}$ of transistor 21.

Equating the voltages in the circuit of FIG. 2 gives:

$$I_{24} R_{25} + V_{BE24} = I_{21} R_{23} + V_{BE21} + I_{36} R_{23}$$

where,
$I_{24}$ is the current through transistor 24
$I_{21}$ is the current through transistor 21
$I_{36}$ is the current through transistor 36
$R_{25}$ is the resistance of resistor 25
$R_{23}$ is the resistance of resistor 23
$V_{BE24}$ is the base-emitter voltage of transistor 24
$V_{BE21}$ is the base-emitter voltage of transistor 21.
However, $$R_{23} = R_{25} \text{ and } I_{24} = I_{21}.$$

Therefore, $$V_{BE24} = V_{BE21} + I_{36} R_{23}$$

and $$V_{BE24} - V_{BE21} = I_{36} R_{23},$$

or $$\Delta V_{BE} = I_{36} R_{23},$$

or $$KT/q \ln n = I_{36} R_{23}.$$

Now $$(I_{21}+I_{36})R_{23}+I_{36}R_{35}=V_{BE32}+I_{32}R_{33},$$

where $R_{35}$ is the resistance of resistor 35
$R_{33}$ is the resistance of resistor 33
$V_{BE32}$ is the base-emitter voltage of transistor 32
$I_{32}$ is the current through transistor 32.

However $$R_{33}=R_{23} \text{ and } I_{21}=I_{32}.$$

Therefore $$I_{36}(R_{23}+R_{35})=V_{BE32},$$

but $$I_{36}=(\Delta V_{BE}/R_{23}).$$

Therefore $$V_{BE32}=\Delta V_{BE}(R_{23}+R_{35}/R_{23})$$

or $$V_{BE32}=\Delta V_{BE}(1+R_{35}/R_{23}).$$

Figure 3:
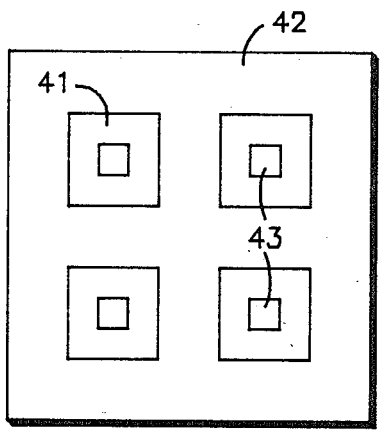
FIG. 3 illustrates a top plan view of an integrated circuit die layout of one transistor in the present invention.
Figure 4:
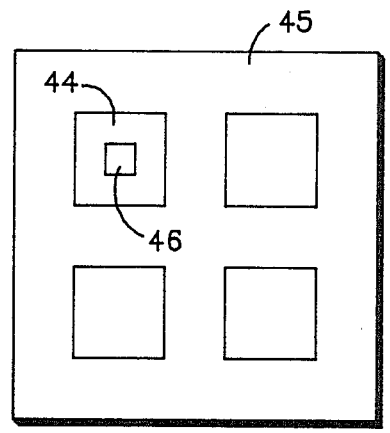
FIG. 4 illustrates a top plan view of an integrated circuit die showing another transistor in the present invention.

Referring to FIGS. 3 and 4, it may be seen how transistor 21 may be scaled to some multiple value greater than transistor 24. A plurality of base regions 41 comprises an N-type epitaxial layer overlying a P-type substrate (not shown). A P-type collector region 42 and a plurality of P-type emitter regions 43 are diffused into the epitaxial layer 41. This multi-emitter structure is well known to those skilled in the art. Referring to FIG. 4, transistor 24 includes a base region 44 comprising an N-type exitaxial layer. A P-type collector region 45 and a single P-type emitter region 46 is diffused into the epitaxial layer 44. Transistor 24 may have any number of emitter regions 46, even though only one is shown. transistor 21 is understood to have any integral multiple emitter regions to that of transistor 24.

Collector regions 42 and 45 are shown to have a box matrix configuration. However, any type of configuration would be sufficient as long as the area of the collector regions 42, 45 are substantially identical. These collector regions 42 and 45 would collect electrons injected into epitaxial layers 41, 44 by the P-substrate when the voltage on the P-substrate rises to $V_{CC}$. This process is disclosed in application Ser. No. 582,356 filed concurrently with this application.

Referring again to FIG. 2, the following analysis will demonstrate that any current injected into the circuit from the P-substrate will have no effect on the thermal shut-down signal at terminal 34. With the feedback circuit in equilibrium, the lateral collector currents of transistors 21, 24 through transistors 31, 29, respectively, are forced to be equal. The substrate currents to collector regions 42, 45 will also be equal due to their identical configuration, even though of unknown value.

Equating the voltages gives:

$$(I_{L24}+I_{S24})R_{25}+V_{BE24}=(I_{L21}+I_{S21})R_{23}+I_{R35}R_{35}+V_{BE21}$$

where
$I_{L24}$ is the lateral current through transistor 24
$I_{L21}$ is the lateral current through transistor 21
$I_{S24}$ is the vertical (substrate) current through transistor 24
$I_{S21}$ is the vertical (substrate) current through transistor 21
$R_{23}$ is the resistance of resistor 23
$R_{25}$ is the resistance of resistor 25
$R_{35}$ is the resistance of resistor 35
$V_{BE24}$ is the base-emitter voltage of transistor 24
$V_{BE21}$ is the base-emitter voltage of transistor 21
$I_{R35}$ is the current through resistor 35. Cancelling the $(I_{L24}+I_{S24})$ and $(I_{L21}+I_{S21})$ terms since the lateral and vertical currents are equal and $R_{25}$ and $R_{23}$ are equal and simplifying gives $$I_{R35} R_{35}=V_{BE24}-V_{BE21}.$$

Therefore $$I_{R35}R_{35}=\Delta V_{BE}$$

and since $$\Delta V_{BE}=(kT/q)\ln n,$$

then $$I_{R35}R_{35}=(KT/q)\ln n.$$

Now $$(I_{L21}+I_{S21}+I_{36})R_{23}+I_{36}R_{35}=V_{BE32}+I_{32}R_{33}$$

where
$I_{36}$ is the current through transistor 36
$I_{32}$ is the current through transistor 36
$R_{33}$ is the resistance of resistor 33
$V_{BE32}$ is the base-emitter voltage of transistor 32.

However $$R_{33}=R_{23} \text{ and } I_{L24}+I_{S21}=I_{32}.$$

Therefore $$V_{BE}=I_{36}(R_{23}+R_{35}),$$

but $$I_{36}=(\Delta V_{BE}/R_{23}).$$

Therefore $$V_{BE32}=\Delta V_{BE}(R_{23}+R_{35}/R_{23})$$

or $$V_{BE32}=\Delta V_{BE}(1+(R_{35}/R_{23}).$$

Therefore, when the voltage $$(R_{23}+R_{35})KT/(R_{23})q\ln n$$

increases with temperature and becomes equal to the decreasing $V_{BE}$ of transistor 32, a signal at the collector of transistor 32 goes to a high state, initiating a shut-down of heat generating circuitry, i.e. the output power transistor.

Since the current through resistor 35 is independent of PNP parasitic substrate current, lateral current and the magnitude of the supply voltage, the circuit also provides an excellent well controlled bias current reference for other chip functions. The current through resistor 35 flows through transistors 36, 37, and provides a well regulated current reference at terminal 38. This current may be used to drive other chip functions. Transistor 37 sets the voltage level at terminal 38 and may be any type of resistive device.

By now it should be appreciated that there has been provided an improved thermal shut-down circuit that is monolithically integrated in a configuration including a P-type substrate as the collector of a power output transistor. The thermal shut-down circuit is self compensating for electrons injected into an N-type epitaxial layer by the substrate when a substrate voltage approaches $V_{CC}$.

We claim:

1. A monolithic integrated thermal shut-down circuit including a first supply voltage terminal, a second supply voltage terminal, and a voltage output terminal, said circuit comprising:

transistor means having a first path coupled between said first and said second supply voltage terminals for conducting a first current and having a second path coupled between a node and said second supply voltage terminal for conducting a second current, said first and second currents having substantially the same value;

first resistive means having a first terminal coupled to said node for conducting a third current;

second resistive means coupled between said first supply voltage terminal and said node for conducting said first current and said third current;

third resistive means having a first terminal coupled to said first supply voltage terminal and having a value substantially the same as said second resistive means for conducting a fourth current;

current establishing means coupled between said second terminal of said first resistive means and said second supply voltage terminal, and coupled to said transistor means for establishing said first current substantially the same as said second current; and output means coupled between a second terminal of said third resistive means and said second supply voltage terminal, and coupled to a second terminal of said first resistive means for providing an output signal at said voltage output terminal.

2. The circuit according to claim 1 further comprising a current output terminal and a regulated current means coupled between said current establishing means and said second supply voltage terminal and responsive to said third current for providing a regulated output current at said current output terminal.

3. The circuit according to claim 1 wherein said transistor means comprises:

a first PNP transistor having an emitter coupled to said first supply voltage terminal and a collector coupled to said second supply voltage terminal;

a second PNP transistor having a base coupled to a base of said first PNP transistor, a collector coupled to said second supply voltage terminal, and an emitter coupled to said node.

4. The circuit according to claim 3 further comprising fourth resistive means coupled between said first supply voltage terminal and said emitter of said first PNP transistor for conducting said second current.

5. The circuit according to claim 4 wherein said output means comprises a third PNP transistor having an emitter coupled to said second terminal of said third resistive means, a collector coupled to said voltage output terminal, and a base coupled to said second terminal of said first resistive means.

6. A circuit having a first supply voltage terminal, a second supply voltage terminal, and an output terminal, comprising:

a first transistor having a collector coupled to said second supply voltage terminal;

a second transistor having a collector coupled to said second supply voltage terminal, said second transistor having an emitter scaled to conduct a larger current than said first transistor;

biasing means coupled to a base of both of said first and second transistors for biasing said first and second transistors;

first resistive means coupled between said first supply voltage terminal and an emitter of said first transistor for conducting a first current;

second resistive means coupled between said first supply voltage terminal and an emitter of said second transistor for conducting a second current;

third resistive means having a first terminal coupled to the emitter of said second transistor for conducting a third current;

current establishing means coupled between a second terminal of said third resistive means and said second supply voltage terminal, and coupled to said collector of said second transistor for establishing said first current substantially the same as said second current;

a third transistor having a collector coupled to said output terminal, an emitter coupled to said first supply voltage terminal, and a base coupled to said second terminal of said third resistive means; and output means coupled between said collector of said third transistor and said second supply voltage terminal for determining a voltage level at said output terminal.

7. The circuit according to claim 6 further comprising fourth resistive means coupled between said first supply voltage terminal and said emitter of said third transistor for conducting a fourth current.

8. An improved thermal shutdown circuit having a first and second supply voltage terminal including a first transistor and a second transistor having their bases coupled to a means for biasing said first and second transistors and their collectors coupled to said second supply voltage terminal by a current mirror, a first resistor coupled between an emitter of said second transistor and said first supply voltage terminal, a third transistor having a collector coupled to a voltage output terminal, the improvement comprising;

a second resistor coupled between said first supply voltage terminal and an emitter of said first transistor;

A third resistor having a first terminal coupled to the emitter of said second transistor second supply voltage terminal and having a second terminal coupled to the base of said third transistor;

current establishing means coupled between said second terminal of said third resistor and said second supply voltage terminal, and coupled to said collector of said first transistor for establishing said first current substantially the same as said second current; and a fourth resistor coupled between said first supply voltage terminal and an emitter of said third transistor.

9. The circuit according to claim 8 wherein the improvement further comprises said second transistor being scaled so that its emitter area is greater than the emitter area of said first transistor and the collector area and configuration of said first and second transistors are substantially similar.

10. The circuit according to claim 9 wherein the improvement further comprises a current output terminal, and regulating means coupled between said second terminal of said third resistor and said current establishing means for supplying a regulated output current at said current output terminal.

* * * * *